US012765280B2

(12) United States Patent
Koshi et al.

(10) Patent No.: US 12,765,280 B2
(45) Date of Patent: Oct. 13, 2026

(54) PROCESSING METHOD, METHOD OF MANUFACTURING SEMICONDUCTOR DEVICE, PROCESSING APPARATUS, AND RECORDING MEDIUM

(71) Applicant: Kokusai Electric Corporation, Tokyo (JP)

(72) Inventors: Yasunobu Koshi, Toyama (JP); Kazuhiro Harada, Toyama (JP); Yuji Urano, Toyama (JP); Shingo Nohara, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 539 days.

(21) Appl. No.: 18/455,678

(22) Filed: Aug. 25, 2023

(65) Prior Publication Data

US 2023/0402281 A1 Dec. 14, 2023

Related U.S. Application Data

(63) Continuation of application No. PCT/JP2021/007373, filed on Feb. 26, 2021.

(51) Int. Cl.
*C23C 16/34* (2006.01)
*C23C 16/44* (2006.01)
(Continued)

(52) U.S. Cl.
CPC ........ *H10P 14/6334* (2026.01); *C23C 16/345* (2013.01); *C23C 16/4404* (2013.01); (Continued)

(58) Field of Classification Search
None
See application file for complete search history.

(56) References Cited

U.S. PATENT DOCUMENTS

2004/0045577 A1* 3/2004 Ji ........................ C23C 16/4405 134/1.1
2007/0077737 A1* 4/2007 Kobayashi .......... C23C 16/4405 438/513
(Continued)

FOREIGN PATENT DOCUMENTS

JP 2004-064018 A 2/2004
JP 2012-019194 A 1/2012
(Continued)

OTHER PUBLICATIONS

International Search Report, PCT/JP2021/007373, Apr. 27, 2021.

*Primary Examiner* — Shamim Ahmed
*Assistant Examiner* — Bradford M Gates
(74) *Attorney, Agent, or Firm* — Volpe Koenig

(57) ABSTRACT

Included are processes of (a) supplying a film-forming gas into a processing container in which a substrate is accommodated to form a film on the substrate, (b) supplying a fluorine-containing gas into the processing container in which the substrate is not accommodated to remove a deposit including the film adhered to the inside of the processing container, (c) supplying a precoat gas into the processing container in which the substrate is not accommodated and from which the deposit is removed to form a precoat film in the processing container, and (d) supplying a film-forming gas into the processing container in which a substrate is accommodated and in which the precoat film is formed to form a film on the substrate, in which, in (c), a film thickness distribution of the precoat film is adjusted in accordance with a distribution of a residual fluorine concentration in the processing container.

20 Claims, 4 Drawing Sheets

(51) Int. Cl.

| | |
|---|---|
| ***C23C 16/52*** | (2006.01) |
| ***H10P 14/60*** | (2026.01) |
| ***H10P 14/694*** | (2026.01) |

(52) U.S. Cl.

CPC .......... *C23C 16/4405* (2013.01); *C23C 16/52* (2013.01); *H10P 14/69433* (2026.01)

(56) References Cited

U.S. PATENT DOCUMENTS

| | | | | |
|---|---|---|---|---|
| 2011/0318937 | A1 | 12/2011 | Akae et al. | |
| 2018/0269055 | A1 | 9/2018 | Hashimoto et al. | |
| 2021/0040609 | A1 | 2/2021 | Harada et al. | |
| 2022/0316058 | A1 | 10/2022 | Harada et al. | |
| 2023/0062105 | A1* | 3/2023 | Wada | C23C 16/4404 |

FOREIGN PATENT DOCUMENTS

| | | | |
|---|---|---|---|
| JP | 2012-216696 | A | 11/2012 |
| JP | 2018-157095 | A | 10/2018 |
| JP | 2021-027227 | A | 2/2021 |

* cited by examiner

PROCESSING METHOD, METHOD OF MANUFACTURING SEMICONDUCTOR DEVICE, PROCESSING APPARATUS, AND RECORDING MEDIUM

CROSS-REFERENCE TO RELATED APPLICATIONS

This application is a Bypass Continuation Applications of PCT International Application No. PCT/JP2021/007373, filed on Feb. 26, 2021, the entire contents of which are incorporated herein by reference.

BACKGROUND

Field

The present disclosure relates to a processing method, a method of manufacturing a semiconductor device, a processing apparatus, and a recording medium.

Description of the Related Art

As one step of a manufacturing step of a semiconductor device, there is a case where a film forming process of forming a film on a substrate accommodated in a processing container is performed, and then a process of cleaning the inside of the processing container is performed.

SUMMARY

However, when cleaning is performed, a film-forming rate decreases in the film forming process performed after the cleaning, and a phenomenon (film thickness drop) in which the thickness of the film formed on the substrate decreases might occur in the processing container. An object of the present disclosure is to suppress occurrence of film thickness drop in the processing container after cleaning.

According to an aspect of the present disclosure, provided is a technology including processes of:

(a) supplying a film-forming gas into a processing container in which a substrate is accommodated to form a film on the substrate;

(b) supplying a fluorine-containing gas into the processing container in which the substrate is not accommodated to remove a deposit including the film adhered to the inside of the processing container;

(c) supplying a precoat gas into the processing container in which the substrate is not accommodated and from which the deposit is removed to form a precoat film in the processing container; and (d) supplying a film-forming gas into the processing container in which a substrate is accommodated and in which the precoat film is formed to form a film on the substrate, in which in (c), a film thickness distribution of the precoat film is adjusted in accordance with a distribution of a residual fluorine concentration in the processing container.

DETAILED DESCRIPTION

Aspect of Present Disclosure

Figure 1:
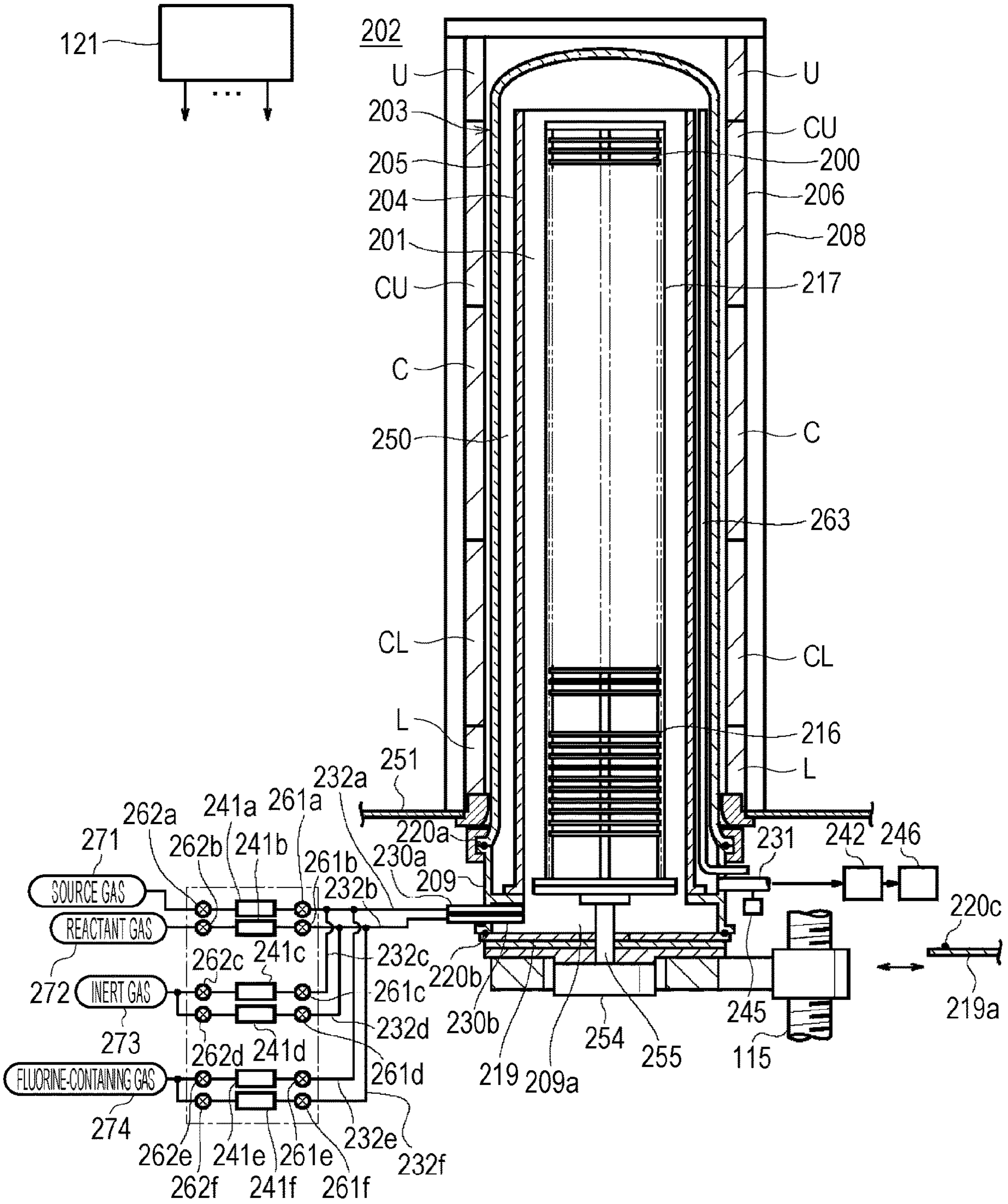
FIG. 1 is a schematic configuration diagram of a vertical processing furnace of a substrate processing apparatus preferably used in an aspect of the present disclosure, and is a longitudinal cross-sectional view of a processing furnace 202.

An aspect of the present disclosure will be hereinafter described mainly with reference to FIG. 1. All the drawings used in the following description are schematic, so that a dimensional relationship between components, a ratio between the components and the like in the drawings do not necessarily coincide with actual ones. Dimensional relationships between the components, ratios of the components and the like do not necessarily coincide among a plurality of drawings.

(1) Configuration of Substrate Processing Apparatus

As illustrated in FIG. 1, a processing furnace 202 includes a heater 206 serving as a temperature regulator (heater). The heater 206 has a cylindrical shape, and is vertically installed by being supported by a heater base 251 serving as a holding plate. The heater 206 is divided into five zones of upper (U), center upper (CU), center (C), center lower (CL), and lower (L) zones in this order from the top, and is configured to be able to individually and independently control temperature of each zone. The heater 206 also functions as an activation mechanism (exciter) that thermally activates (excites) gas. A heat insulating material 208 is provided around and above the heater 206 so as to cover them.

Inside the heater 206, a process tube 203 serving as a reaction tube is disposed concentrically with the heater 206. The process tube 203 is provided with an inner tube 204 serving as an inner reaction tube and an outer tube 205 serving as an outer reaction tube provided outside the same. The inner tube 204 is formed of a heat-resistant material such as quartz ($SiO_2$) or silicon carbide (SiC), for example, and is formed into a cylindrical shape with upper and lower ends opened. A processing chamber 201 in which processes are performed on a wafer 200 serving as a substrate is formed in a cylindrical hollow portion of the inner tube 204. The processing chamber 201 is configured to be able to accommodate a boat 217 to be described later. The outer tube 205 is formed of, for example, a heat-resistant material such as quartz or SiC, has an inner diameter larger than an outer diameter of the inner tube 204, is formed into a cylindrical shape with an upper end closed and a lower end opened, and is provided concentrically with the inner tube 204.

Below the outer tube 205, a manifold 209 is disposed concentrically with the outer tube 205. The manifold 209 is formed of a metal material such as stainless steel (SUS), for example, into a cylindrical shape with upper and lower ends opened. The manifold 209 engages with and supports the inner tube 204 and the outer tube 205. An O-ring **220*a* serving as a seal member is provided between the manifold 209 and the outer tube 205. The process tube 203 is vertically installed as is the case with the heater 206. A processing container (reaction container) is formed mainly of the process tube 203 and the manifold 209. A space in the processing container formed of the process tube 203 and the manifold 209 can also be referred to as the processing chamber 201**.

Furthermore, there is a case where a region corresponding to the U zone in the processing container is referred to as an upper region. There also is a case where a region corresponding to the CU zone in the processing container is included in the upper region. There is a case where a region corresponding to the L zone in the processing container is referred to as a lower region. There also is a case where a region below the L zone in the processing container, for example, a region in which the manifold 209, and a heat insulating plate 216, a seal cap 219 and the like to be described later are located is included in the lower region. There also is a case where a region corresponding to the CL zone in the processing container is included in the lower region. There is a case where a region corresponding to the C zone in the processing container is referred to as a center region. There also is a case where a region corresponding to at least any one of the CU zone and the CL zone in the processing container is included in the center region.

Nozzles 230*a* and 230*b* serving as gas introducers are connected to the manifold 209 so as to be communicated with the processing chamber 201. Gas supply tubes 232*a* and 232*b* are connected to the nozzles 230*a* and 230*b*, respectively.

The gas supply tubes 232*a* and 232*b* are provided with gas supply sources 271 and 272, valves 262*a* and 262*b* serving as open/close valves, mass flow controllers (MFCs) 241*a* and 241*b* serving as flow rate controllers, and valves 261*a* and 261*b*, respectively, in this order from an upstream side of a gas flow.

Gas supply tubes 232*c* and 232*d* are connected to a downstream side from the valves 261*a* and 262*b* of the gas supply tubes 232*a* and 232*b*, respectively. The gas supply tubes 232*c* and 232*d* are provided with a gas supply source 273, valves 262*c* and 262*d*, MFCs 241*c* and 241*d*, and valves 261*c* and 261*d* in this order from the upstream side of the gas flow.

Gas supply tubes 232*e* and 232*f* are connected to downstream sides from the valves 261*a* and 261*b* of the gas supply tubes 232*a* and 232*b*, respectively, and further downstream sides from the connection to the gas supply tubes 232*c* and 232*d*. The gas supply tubes 232*e* and 232*f* are provided with a gas supply source 274, valves 262*e* and 262*f*, MFCs 241*e* and 241*f*, and valves 261*e* and 261*f* in this order from the upstream side of the gas flow.

The gas supply tubes 232*a* to 232*f* are formed of a metal material such as SUS.

A source gas is supplied from the gas supply tube 232*a* into the processing chamber 201 via the gas supply source 271, the valve 262*a*, the MFC 241*a*, and the valve 261*a*. In this specification, there also is a case where the source gas is referred to as a source for convenience.

A reactant gas is supplied from the gas supply tube 232*b* into the processing chamber 201 via the gas supply source 272, the valve 262*b*, the MFC 241*b*, and the valve 261*b*. In this specification, there also is a case where the reactant gas is referred to as a reactant for convenience.

An inert gas is supplied from the gas supply tubes 232*c* and 232*d* into the processing chamber 201 via the gas supply source 273, the valves 262*c* and 262*d*, the MFCs 241*c* and 241*d*, and the valves 261*c* and 261*d*. The inert gas acts as a purge gas, a carrier gas, a diluent gas and the like.

A fluorine (F)-containing gas is supplied from the gas supply tubes 232*e* and 232*f* into the processing chamber 201 via the gas supply source 274, the valves 262*e* and 262*f*, the MFCs 241*e* and 241*f*, and the valves 261*e* and 261*f*. In this specification, there also is a case where the F-containing gas is referred to as a cleaning gas for convenience.

A source gas supply system is formed mainly of the gas supply tube 232*a*, the MFC 241*a*, and the valves 261*a* and 262*a*. The gas supply source 271 may be included in the source gas supply system. A reactant gas supply system is formed mainly of the gas supply tube 232*b*, the MFC 241*b*, and the valves 261*b* and 262*b*. The gas supply source 272 may be included in the reactant gas supply system. An inert gas supply system is formed mainly of the gas supply tubes 232*c* and 232*d*, the MFCs 241*c* and 241*d*, and the valves 261*c*, 262*c*, 261*d*, and 262*d*. The gas supply source 273 may be included in the inert gas supply system. A fluorine-containing gas supply system is formed mainly of the gas supply tubes 232*e* and 232*f*, the MFCs 241*e* and 241*f*, and the valves 261*e*, 262*e*, 261*f*, and 262*f*. The gas supply source 274 may be included in the fluorine-containing gas supply system.

Furthermore, each or both of the source gas and the reactant gas is (are) also referred to as a film-forming gas, and each or both of the source gas supply system and the reactant gas supply system is (are) also referred to as a film-forming gas supply system. In a case where the film-forming gas is used as a precoat gas to be described later, the film-forming gas supply system is also referred to as a precoat gas supply system. The F-containing gas supply system is also referred to as a cleaning gas supply system.

Any or all gas supply system(s) out of the various gas supply systems described above may be formed as an integrated gas supply system 248 in which the valves 261*a* to 261*f* and 262*a* to 262*f*, the MFCs 241*a* to 241*f* and the like are integrated. The integrated gas supply system 248 is connected to each of the gas supply tubes 232*a* to 232*f*, and is configured such that a supply operation of various gases into the gas supply tubes 232*a* to 232*f*, that is, an opening/closing operation of the valves 261*a* to 261*f* and 262*a* to 262*f*, a flow rate regulating operation by the MFCs 241*a* to 241*f* and the like are controlled by a controller 121 to be described later. The integrated gas supply system 248 is formed as an integrated or divided integrated unit, and is configured to be able to be attached to and detached from the gas supply tubes 232*a* to 232*f* and the like in units of integrated units and to be able to perform maintenance, replacement, expansion and the like of the integrated gas supply system 248 in units of integrated units.

The manifold 209 is provided with an exhaust pipe 231 that discharges an atmosphere in the processing chamber 201. The exhaust pipe 231 is formed of a metal material such as SUS. The exhaust pipe 231 is arranged at a lower end of a cylindrical space 250 formed of a gap between the inner tube 204 and the outer tube 205 and communicates with the cylindrical space 250. A vacuum pump 246 serving as a vacuum exhauster is connected to the exhaust pipe 231 via a pressure sensor 245 serving as a pressure detector (pressure detector) that detects a pressure in the processing chamber 201 and an auto pressure controller (APC) valve 242 serving as a pressure regulator (pressure regulator). The APC valve 242 is configured to be able to open and close the valve, with the vacuum pump 246 in operation, to vacuum-exhaust and stop vacuum-exhausting the processing chamber 201, and further configured to be able to regulate a degree of valve opening based on pressure information detected by the pressure sensor 245, with the vacuum pump

246 in operation, to regulate the pressure in the processing chamber 201. An exhaust system is formed mainly of the exhaust pipe 231, the APC valve 242, and the pressure sensor 245. The vacuum pump 246 may be included in the exhaust system.

A lower end opening of the manifold 209 is used as a substrate transfer port 209*a* for transferring the wafer 200 into and out of the processing container, that is, into and out of the processing chamber 201. Below the manifold 209, provided is a seal cap 219 serving as a furnace opening lid capable of hermetically closing the substrate transfer port 209*a* in a state in which the boat 217 to be described later is carried into the processing chamber 201. The seal cap 219 is formed of a metal material such as SUS in a discoid shape, for example. An O-ring 220*b* serving as a seal member that abuts the lower end of the manifold 209 is provided on an upper surface of the seal cap 219. A rotation mechanism 254 that rotates the boat 217 is provided below the seal cap 219. A rotary shaft 255 of the rotation mechanism 254 is formed of a metal material such as SUS, for example, penetrates the seal cap 219, and is connected to the boat 217. The rotation mechanism 254 is configured to rotate the boat 217 to rotate the wafer 200. The seal cap 219 is configured to be raised and lowered in a vertical direction by a boat elevator 115 serving as a raising/lowering mechanism provided outside the process tube 203. The boat elevator 115 is formed as a conveyor (conveyance mechanism) that raises or lowers the seal cap 219 to carry the wafer 200 in and out of the processing chamber 201 (transfer).

Below the manifold 209, provided is a shutter 219*a* serving as a furnace opening lid capable of hermetically closing the substrate transfer port 209*a* in a state in which the seal cap 219 is lowered and the boat 217 is carried out of the processing chamber 201. The shutter 219*a* is formed of a metal material such as SUS in a discoid shape, for example. The shutter 219*a* is configured to hermetically close the lower end of the manifold 209 by raising and lowering and rotating. An O-ring 220*c* serving as a seal member that abuts the lower end of the manifold 209 is provided on an upper surface of the shutter 219*a*. An opening/closing operation (raising/lowering operation, a rotating operation and the like) of the shutter 219*a* is controlled by a shutter opening/closing mechanism 115*s* illustrated in FIG. 2.

The boat 217 serving as a substrate holder is configured to arrange (support) a plurality of, for example, 25 to 200 wafers 200 in a horizontal posture and with centers aligned in multiple stages in the vertical direction, that is, to arrange at intervals. The boat 217 is formed of a heat-resistant material such as quartz and SiC. The boat 217 is configured to arrange (support) a plurality of, for example, 2 to 20 heat insulating plates 216 in a horizontal posture and with centers aligned in multiple stages in the vertical direction, that is, to arrange at intervals in a region below the region in which the wafers 200 are arranged (manifold 209 side). The heat insulating plate 216 is formed of, for example, a heat-resistant material such as quartz and SiC. Since the heat insulating plate 216 is provided below the region in which the wafers 200 are arranged, heat from the heater 206 is less likely to be transferred to the manifold 209 side.

In the process tube 203, a temperature sensor 263 serving as a temperature detector is provided. A degree of energization to each of the five zones (L, CL, C, CU, and U) included in the heater 206 is independently adjusted based on temperature information detected by the temperature sensor 263, so that the temperature in the processing chamber 201 has a desired temperature distribution. The temperature sensor 263 is provided along an inner wall of the process tube 203.

Figure 2:
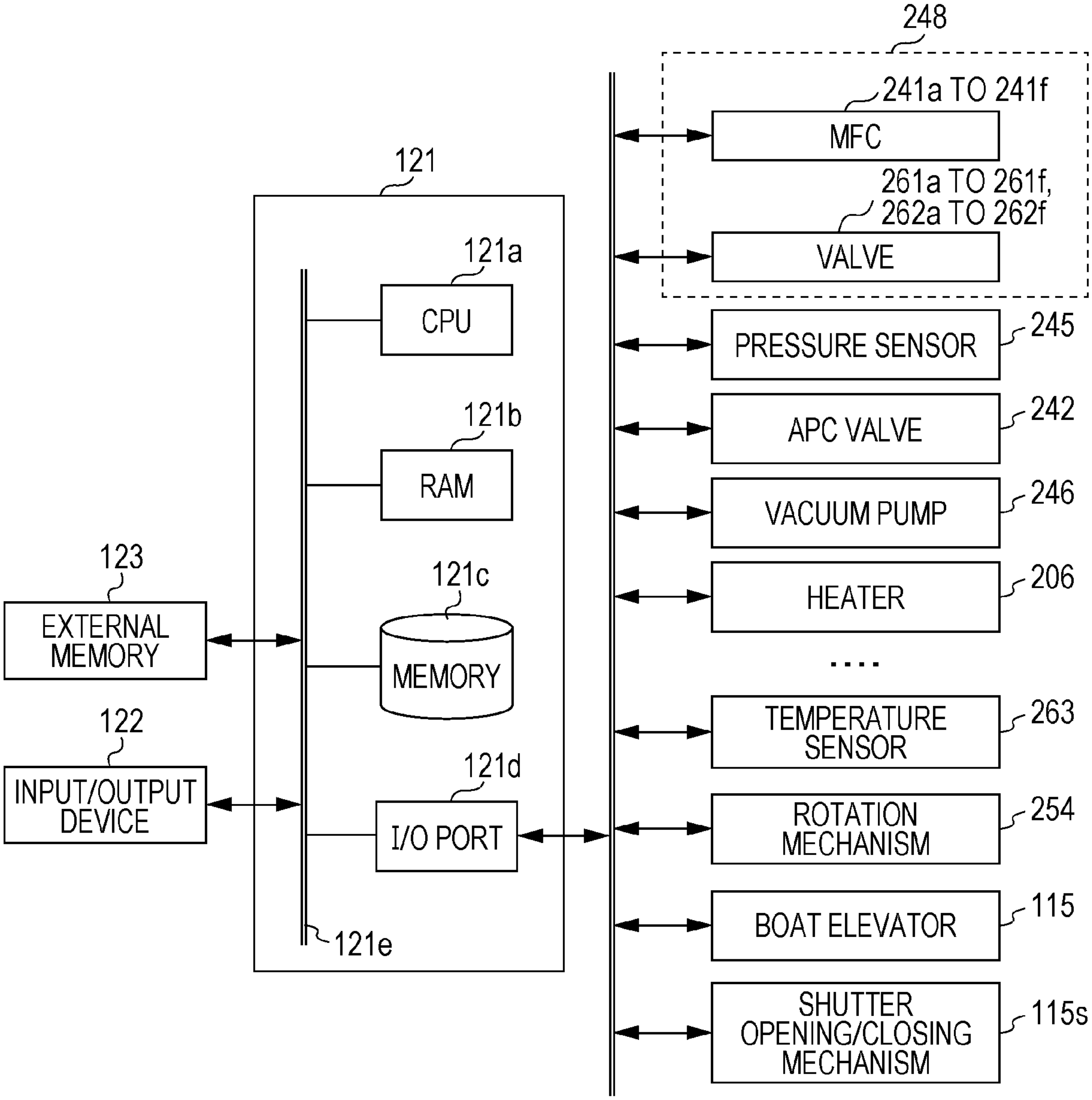
FIG. 2 is a schematic configuration diagram of a controller 121 of the substrate processing apparatus preferably used in an aspect of the present disclosure, and is a block diagram illustrating a control system of the controller 121.

As illustrated in FIG. 2, the controller 121 as a controller (control means) is configured as a computer provided with a central processing unit (CPU) 121*a*, a random access memory (RAM) 121*b*, a memory 121*c*, and an I/O port 121*d*. The RAM 121*b*, the memory 121*c*, and the I/O port 121*d* may exchange data with the CPU 121*a* via an internal bus 121*e*. An input/output device 122 formed as, for example, a touch panel and the like and an external memory 123 are connectable to the controller 121.

The memory 121*c* is formed of, for example, a flash memory, a hard disk drive (HDD), a solid state drive (SSD) and the like. In the memory 121*c*, a control program for controlling the operation of the substrate processing apparatus, a process recipe in which a procedure, a condition and the like of a substrate process to be described later are described, a cleaning recipe in which a procedure, a condition and the like of a cleaning process to be described later are described, a precoat recipe in which a procedure, a condition and the like of a precoat process to be described later are described and the like are readably stored. The process recipe combined to allow the controller 121 to execute each procedure in the substrate process to be described later to obtain a predetermined result functions as a program. The cleaning recipe combined to allow the controller 121 to execute each procedure in the cleaning process to be described later to obtain a predetermined result functions as a program. The precoat recipe combined to allow the controller 121 to execute each procedure in the precoat process to be described later to obtain a predetermined result functions as a program. Hereinafter, the process recipe, the cleaning recipe, the precoat recipe, the control program and the like are also collectively and simply referred to as a program. The process recipe, the cleaning recipe, and the precoat recipe are also simply referred to as recipes. In this specification, there are cases where the term "program" indicates the recipe alone, the control program alone, or both of them. The RAM 121*b* is formed as a memory area (work area) in which programs, data and the like read by the CPU 121*a* are temporarily stored.

The I/O port 121*d* is connected to the MFCs 241*a* to 241*f*, the valves 261*a* to 261*f*, and 262*a* to 262*f*, the pressure sensor 245, the APC valve 242, the vacuum pump 246, the temperature sensor 263, the heater 206, the rotation mechanism 254, the boat elevator 115, the shutter opening/closing mechanism 115*s* and the like described above.

The CPU 121*a* is configured to be able to read the control program from the memory 121*c* to execute, and read the recipe from the memory 121*c* in response to an input of an operation command from the input/output device 122 and the like. The CPU 121*a* is configured to be able to control flow rate regulating operations of various gases by the MFCs 241*a* to 241*f*, opening/closing operations of the valves 261*a* to 261*f* and 262*a* to 262*f*, a pressure regulating operation by the APC valve 242 based on an opening/closing operation of the APC valve 242 and the pressure sensor 245, start and stop of the vacuum pump 246, a temperature regulating operation of the heater 206 based on the temperature sensor 263, rotation and rotation speed regulating operation of the boat 217 by the rotation mechanism 254, a raising/lowering operation of the boat 217 by the boat elevator 115, an opening/closing operation of the shutter 219*a* by the shutter opening/closing mechanism 115*s* and the like according to the contents of the read recipe.

The controller 121 can be configured by installing the above-described program stored in the external memory 123 into the computer. Examples of the external memory 123 include a magnetic disk such as an HDD, an optical disk such as a CD, a magneto-optical disk such as an MO, a semiconductor memory such as a USB memory or an SSD and the like, for example. The memory 121*c* and the external memory 123 are configured as computer-readable recording media. Hereinafter, they are collectively and simply referred to as a recording medium. In this specification, there are cases where the term "recording medium" indicates the memory 121*c* alone, the external memory 123 alone, or both of them. The program may be provided to the computer via a communication means such as the Internet and a dedicated line, in place of the external memory 123.

(2) Film Forming Process (Before Cleaning)

Figure 4:
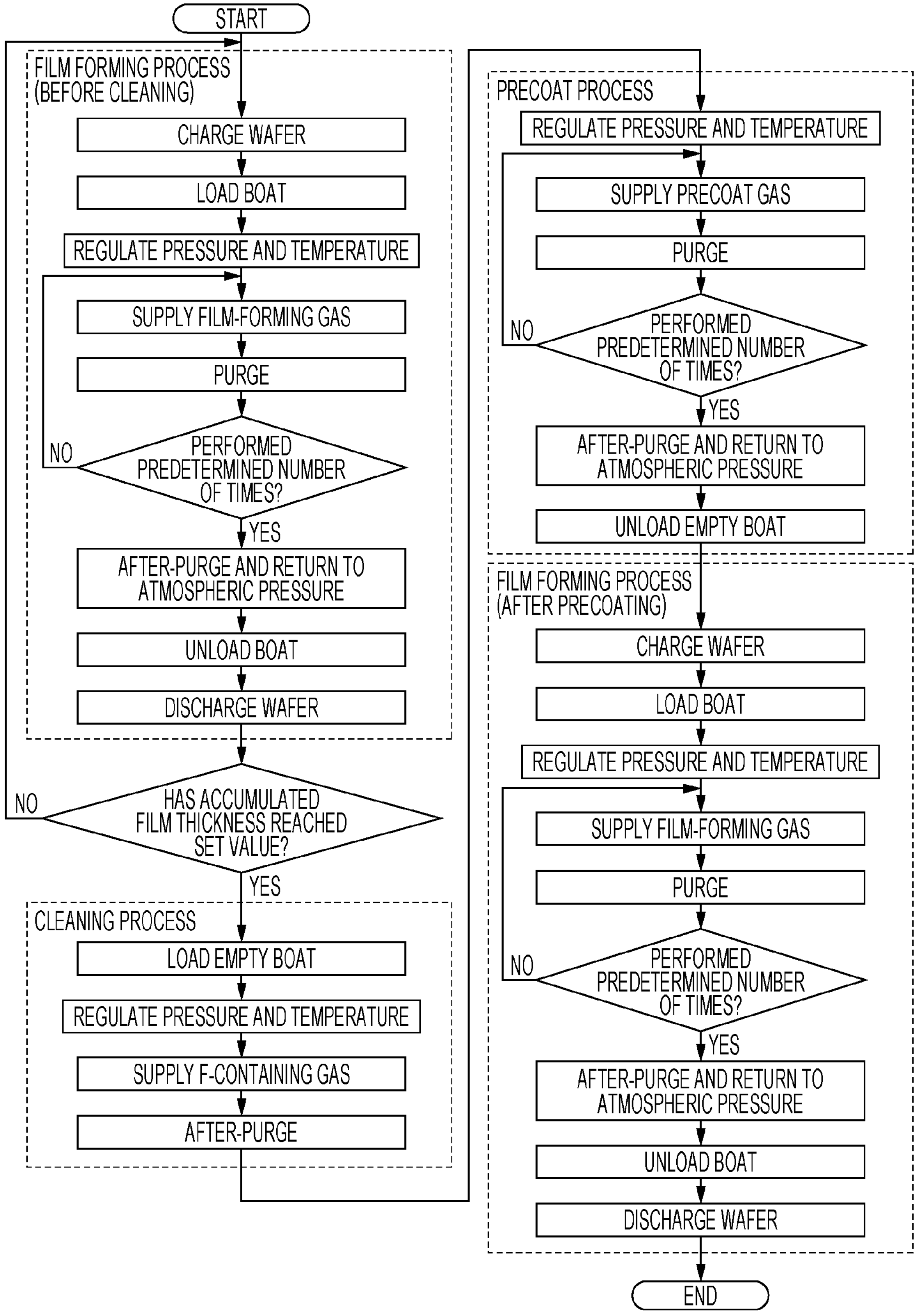
FIG. 4 is a flowchart at one step of a manufacturing step of the semiconductor device performed in an aspect of the present disclosure.

A sequence example of processing the wafer 200 serving as the substrate, that is, a film-forming sequence example of forming a film on the wafer 200 serving as one step of a manufacturing step of the semiconductor device using the above-described substrate processing apparatus will be described mainly with reference to FIG. 4. In the following description, the controller 121 controls an operation of each unit forming the substrate processing apparatus.

In the film-forming sequence in this aspect, the film-forming gas is supplied into the processing container in which the wafer 200 is accommodated to form a film on the wafer 200.

Hereinafter, an example of forming a nitride film as the film will be described. Here, the nitride film includes the nitride film containing carbon (C), oxygen (O), boron (B) and the like in addition to the silicon nitride film (SiN film). That is, the nitride film includes a silicon nitride film (SiN film), a silicon carbonitride film (SiCN film), a silicon oxynitride film (SiON film), a silicon oxycarbonitride film (SiOCN film), a silicon boron carbonitride film (SiBCN film), a silicon boron nitride film (SiBN film), a silicon boron oxycarbonitride film (SiBOCN film), a silicon boron oxynitride film (SiBON film) and the like. Hereinafter, an example of forming the SiN film as the nitride film will be described.

Hereinafter, an example will be described in which a cycle including a step of supplying the source gas as the film-forming gas to the wafer 200 and a step of supplying the reactant gas as the film-forming gas to the wafer 200 is performed a predetermined number of times (m times, m is an integer of 1 or larger) in a film forming process. However, the step of supplying the source gas and the step of supplying the reactant gas can be performed alternately, that is, non-simultaneously, or these steps can be performed simultaneously. In this specification, a processing sequence in which these steps are performed non-simultaneously, and a processing sequence in which these steps are performed simultaneously may be expressed as follows for convenience. A similar expression will be used in the following description of other aspects, variations and the like. Hereinafter, in this aspect, an example in which these steps are simultaneously performed, that is, the latter processing sequence example will be described as an example.

(Source gas→reactant gas)×*m*

(Source gas+reactant gas)×*m*

In this specification, there are cases where the term "wafer" means a wafer itself, or means a laminate of the wafer and a predetermined layer or film formed on a surface thereof. In this specification, there are cases where the term "surface of the wafer" means the surface of the wafer itself or means the surface of a predetermined layer and the like formed on the wafer. In this specification, the phrase "forming a predetermined layer on the wafer" means directly forming a predetermined layer on the surface of the wafer itself, or forming a predetermined layer on the layer and the like formed on the wafer. In this specification, the term "substrate" is synonymous with the term "wafer".

(Wafer Charge)

A plurality of wafers 200 is charged into the boat 217 (wafer charge). Thereafter, the shutter 219*a* is moved by the shutter opening/closing mechanism 115*s*, and the lower end opening of the manifold 209 is opened (shutter open).

(Boat Loading)

Thereafter, as illustrated in FIG. 1, the boat 217 supporting the plurality of wafers 200 is elevated by the boat elevator 115 and is carried into the processing chamber 201 (boat loading). In this state, the lower end of the manifold 209 is sealed with the seal cap 219 via the O-ring 220*b*.

(Pressure Regulation and Temperature Regulation)

After the boat loading is finished, the inside of the processing chamber 201, that is, the space in which the wafers 200 are present is vacuum-exhausted (decompression-exhausted) by the vacuum pump 246 so as to achieve a desired pressure (vacuum degree). At that time, the pressure in the processing chamber 201 is measured by the pressure sensor 245, and the APC valve 242 is feedback-controlled based on the measured pressure information (pressure regulation). The heater 206 heats in such a manner that the wafers 200 in the processing chamber 201 reach desired processing temperature. At that time, the degree of energization to the heater 206, that is the degree of energization to each of the five zones (L, CL, C, CU, and U) included in the heater 206 is independently feedback-controlled based on temperature information detected by the temperature sensor 263, so that the temperature in the processing chamber 201 has a desired temperature distribution (temperature regulation). The rotation mechanism 254 starts to rotate the wafers 200. The exhaust in the processing chamber 201, the heating and the rotation of the wafers 200 are continuously performed at least until the process to the wafers 200 is finished.

(Film Forming Process)

Thereafter, following steps 1 and 2 are sequentially executed.

[Step 1]

At step 1, the source gas and the reactant gas are simultaneously supplied as the film-forming gas to the wafers 200 in the processing chamber 201.

Specifically, the valves 261*a*, 262*a*, 261*b*, and 262*b* are opened, and the source gas and the reactant gas are allowed to flow into the gas supply tubes 232*a* and 232*b*, respectively. The source gas and the reactant gas are supplied into the processing chamber 201 via the nozzles 230*a* and 230*b* after the flow rate of which is regulated by the MFCs 241*a* and 241*b*, respectively. The source gas and the reactant gas supplied into the processing chamber 201 rise in the processing chamber 201, flow out from the upper end opening of the inner tube 204 to the cylindrical space 250, flow down in the cylindrical space 250, and then are discharged from the exhaust pipe 231. In this process, the source gas and the reactant gas are mixed, and the mixed source gas and reactant gas are supplied to the wafers 200 (film-forming gas supply). At that time, the valves 261*c*, 262*c*, 261*d*, and 262*d* may be opened to supply the inert gas into the processing chamber 201 via the nozzles 230*a* and 230*b*.

Processing conditions at this step are exemplified as follows:

- processing temperature: 600 to 850° C., preferably 650 to 800° C.,
- processing pressure: 1 to 2666 Pa, preferably 13 to 1333 Pa, source gas supply flow rate: 0.01 to 2 slm, preferably 0.05 to 0.2 slm,
- reactant gas supply flow rate: 0.1 to 10 slm, preferably 0.5 to 2 slm,
- inert gas supply flow rate (for each gas supply tube): 0 to 5 slm, and
- each gas supply time: 1 to 600 minutes, preferably 1 to 60 minutes.

Herein expression of a numerical value range such as "1 to 2666 Pa" in this specification means that a lower limit value and an upper limit value are included in the range. Therefore, for example, "1 to 2666 Pa" means "equal to or higher than 1 Pa and equal to lower than 2666 Pa". The same applies to other numerical value ranges. In this specification, the processing temperature means the temperature of the wafer 200 or the temperature in the processing chamber 201, and the processing pressure means the pressure in the processing chamber 201. The gas supply flow rate: 0 slm means a case where the gas is not supplied. The same applies to the following description.

By performing step 1 under the above-described processing conditions using, for example, a chlorosilane-based gas to be described later as the source gas and using, for example, a nitriding gas to be described later as the reactant gas, a layer containing Si and N, that is, a silicon nitride layer (SiN layer) is formed on an outermost surface of the wafer 200 serving as a base by a thermal CVD reaction.

As the source gas, for example, a silane-based gas containing silicon (Si) serving as a main element forming the film formed on the wafer 200 can be used. As the silane-based gas, for example, a gas containing Si and halogen, that is, a halosilane-based gas can be used. Halogen includes, chlorine (Cl), fluorine (F), bromine (Br), iodine (I) and the like. As the halosilane-based gas, for example, a chlorosilane-based gas containing Si and Cl can be used.

As the source gas, for example, a chlorosilane-based gas such as a monochlorosilane ($SiH_3Cl$, abbreviated as MCS) gas, a dichlorosilane ($SiH_2Cl_2$, abbreviated as DCS) gas, a trichlorosilane ($SiHCl_3$, abbreviated as TCS) gas, a tetrachlorosilane ($SiCl_4$, abbreviated as STC) gas, a hexachlorodisilane ($Si_2Cl_6$, abbreviated as HCDS) gas, or an octachlorotrisilane ($Si_3Cl_8$, abbreviated as OCTS) gas can be used. One or more of them can be used as the source gas.

As the source gas, in addition to the chlorosilane-based gas, for example, a fluorosilane-based gas such as a tetrafluorosilane ($SiF_4$) gas or a difluorosilane ($SiH_2F_2$) gas, a bromosilane-based gas such as a tetrabromosilane ($SiBr_4$) gas or a dibromosilane ($SiH_2Br_2$) gas, or an iodosilane-based gas such as a tetraiodosilane ($SiI_4$) gas or a diiodosilane ($SiH_2I_2$) gas can also be used. One or more of them can be used as the source gas.

As the source gas, in addition to them, for example, a gas containing Si and an amino group, that is, an aminosilane-based gas can also be used. The amino group is a monovalent functional group obtained by removing H from ammonia, a primary amine, or a secondary amine, and can be represented as $—NH_2$, —NHR, or $—NR_2$. R represents an alkyl group, and two Rs of $—NR_2$ may be the same or different.

As the source gas, for example, an aminosilane-based gas such as a tetrakis(dimethylamino) silane ($Si[N(CH_3)_2]_4$, abbreviated as 4DMAS) gas, a tris(dimethylamino) silane ($Si[N(CH_3)_2]_3H$, abbreviated as 3DMAS) gas, a bis(diethylamino) silane ($Si[N(C_2H_5)_2]_2H_2$, abbreviated as BDEAS) gas, a bis(tertiarybutylamino) silane ($SiH_2[NH(C_4H_9)]_2$, abbreviation: BTBAS) gas, or a (diisopropylamino) silane ($SiH_3[N(C_3H_7)_2]$, abbreviated as DIPAS) gas can also be used. One or more of them can be used as the source gas.

As the reactant gas, nitrogen (N) being a nitriding gas (nitriding agent) and hydrogen (H)-containing gas can be used, for example. The N and H-containing gas is both an N-containing gas and an H-containing gas. The N and H-containing gas preferably has an N—H bond.

As the reactant gas, a hydrogen nitride-based gas such as an ammonia ($NH_3$) gas, a diazene ($N_2H_2$) gas, a hydrazine ($N_2H_4$) gas, and a $N_3He$ gas can be used, for example. One or more of them can be used as the reactant gas.

As the reactant gas, for example, a nitrogen (N), carbon (C), and hydrogen (H)-containing gas can be used in addition to them. As the N, C, and H-containing gas, for example, an amine-based gas or an organic hydrazine-based gas can be used. The N, C, and H-containing gas is an N-containing gas, a C-containing gas, an H-containing gas, and an N and C-containing gas.

As the reactant gas, for example, an ethylamine-based gas such as a monoethylamine ($C_2H_5NH_2$, abbreviated as MEA) gas, a diethylamine ($(C_2H_5)_2NH$, abbreviated as DEA) gas, and a triethylamine ($(C_2H_5)_3N$, abbreviated as TEA) gas, a methylamine-based gas such as a monomethylamine ($CH_3NH_2$, abbreviated as MMA) gas, a dimethylamine ($(CH_3)_2NH$, abbreviated as DMA) gas, and a trimethylamine ($(CH_3)_3N$, abbreviated as TMA) gas, and an organic hydrazine-based gas such as a monomethylhydrazine ($(CH_3)HN_2H_2$, abbreviated as MMH) gas, a dimethylhydrazine ($(CH_3)_2N_2H_2$, abbreviated as DMH) gas, and a trimethylhydrazine ($(CH_3)_2N_2(CH_3)H$, abbreviated as TMH) gas may be used. One or more of them can be used as the reactant gas.

As the inert gas, for example, a rare gas such as a nitrogen ($N_2$) gas, an argon (Ar) gas, a helium (He) gas, a neon (Ne) gas, and a xenon (Xe) gas can be used. One or more of them can be used as the inert gas. The same applies to each step described later.

[Step 2]

After step 1 is finished, the valves 261*a*, 262*a*, 261*b*, and 262*b* are closed, and the supply of the source gas and the reactant gas into the processing chamber 201 is stopped. Then, the inside of the processing chamber 201 is vacuum-exhausted to remove the gas and the like remaining in the processing chamber 201 from the inside of the processing chamber 201 (purge). At that time, the valves 261*c*, 262*c*, 261*d*, and 262*d* may be opened to supply a purge gas into the processing chamber 201 and discharge via the exhaust pipe 231.

Processing conditions at this step are exemplified as follows:

- processing pressure: 1 to 20 Pa, preferably 1 to 10 Pa,
- purge gas supply flow rate: 0 to 10 slm, preferably 0 to 5 slm, and
- purge time: 1 to 60 minutes, preferably 1 to 10 minutes. Other processing conditions can be similar to the processing conditions at step 1. As the purge gas, the reactant gas and inert gas described above can be used.

[Predetermined Number of Times of Performance]

When a cycle in which steps 1 and 2 described above are performed not simultaneously, that is, asynchronously, is performed a predetermined number of times (m times: m is an integer of 1 or larger), a silicon nitride film (SiN film) having a desired thickness may be formed, for example, as the film on the surface of the wafer 200. Preferably, the cycle described above is repeated a plurality of times. That is, it is preferable to make the SiN layer formed per cycle thinner than the desired film thickness and repeat the above-described cycle a plurality of times until the thickness of the SiN film formed by stacking the SiN layer becomes the desired thickness. In a case where the N, C, and H-containing gas is used as the reactant gas, for example, a silicon carbonitride film (SiCN film) can be formed as the film on the surface of the wafer 200.

(After-Purge and Atmospheric Pressure Restoration)

After the formation of the film on the wafer 200 is finished, the inert gas is supplied as the purge gas from each of the nozzles 230*a* and 230*b* into the processing chamber 201 and is discharged from the exhaust pipe 231. As a result, the inside of the processing chamber 201 is purged, and a gas, a by-product and the like remaining in the processing chamber 201 are removed from the inside of the processing chamber 201 (after-purge). Thereafter, the atmosphere in the processing chamber 201 is replaced with the inert gases (inert gas replacement), so that the pressure in the processing chamber 201 is restored to a normal pressure (atmospheric pressure restoration).

(Boat Unloading)

Thereafter, the boat elevator 115 lowers the seal cap 219, so that the lower end of the manifold 209 is opened. Then, the processed wafer 200 is carried out of the process tube 203 from the lower end opening of the manifold 209 in a state of being supported by the boat 217 (boat unloading). After the boat unloading, the shutter 219*a* is moved, so that the lower end opening of the manifold 209 is sealed with the shutter 219*a* via the O-ring 220*c* (shutter close).

(Wafer Discharge)

After the boat unloading, that is, after the shutter close, the processed wafer 200 is cooled to predetermined temperature at which the wafer can be taken out in a state of being supported by the boat 217 (wafer cooling). After the wafer is cooled, the processed wafer 200 cooled to predetermined temperature at which the wafer can be taken out is taken out of the boat 217 (wafer discharge).

(3) Cleaning Process

When the film forming process described above is performed, a deposit including the film adheres to a surface of a member in the processing container, for example, an inner wall surface of the process tube 203, a surface of the boat 217 and the like. Therefore, after the above-described film forming process is executed a predetermined number of times (one or more times), a process of supplying the F-containing gas into the processing container in which the wafer 200 is not accommodated and removing the deposit including the film adhered to the processing container is performed. Hereinafter, a sequence example of the cleaning process, that is, a cleaning sequence example will be described mainly with reference to FIG. 4. In the following description, an operation of each unit forming the substrate processing apparatus is controlled by the controller 121.

(Empty Boat Loading)

The shutter 219*a* is moved by the shutter opening/closing mechanism 115*s*, and the lower end opening of the manifold 209 is opened (shutter open). Thereafter, the empty boat 217 with the deposit including the film adhered to a surface thereof, that is, the boat 217 that does not hold the wafer 200 is elevated by the boat elevator 115 and carried into the processing chamber 201 with the deposit including the film adhered to the surface thereof (empty boat loading). In this state, the lower end of the manifold 209 is sealed with the seal cap 219 via the O-ring 220*b*. The empty boat 217 does not hold the wafer 200, but might hold the heat insulating plate 216, that is, remain holding the heat insulating plate 216, for example.

(Pressure Regulation and Temperature Regulation)

After the empty boat loading is finished, the inside of the processing chamber 201 is vacuum-exhausted (decompression-exhausted) by the vacuum pump 246 so as to achieve a desired pressure (vacuum degree). At that time, the pressure in the processing chamber 201 is measured by the pressure sensor 245, and the APC valve 242 is feedback-controlled based on the measured pressure information (pressure regulation). The inside of the processing chamber 201 is heated by the heater 206 so as to reach desired processing temperature. At that time, the degree of energization to the heater 206, that is the degree of energization to each of the five zones (L, CL, C, CU, and U) included in the heater 206 is independently feedback-controlled based on temperature information detected by the temperature sensor 263, so that the temperature in the processing chamber 201 has a desired temperature distribution (temperature regulation). Rotation of the empty boat 217 by the rotation mechanism 254 is started. The operation of the vacuum pump 246, the heating of the inside of the processing chamber 201, and the rotation of the boat 217 are all continuously performed at least until the cleaning process is finished. However, the boat 217 does not have to be rotated.

(F-Containing Gas Supply)

Thereafter, the F-containing gas is supplied into the processing chamber 201 in which the wafer 200 is not accommodated.

Specifically, the valves 261*e*, 262*e*, 261*f*, and 262*f* are opened, and the F-containing gas flows from the gas supply source 274 into the gas supply tubes 232*e* and 232*f*. The F-containing gas is supplied into the processing chamber 201 via the nozzles 230*a* and 230*b* after the flow rate of which is regulated by the MFCs 241*e* and 241*f*. The F-containing gas supplied into the processing chamber 201 rises in the processing chamber 201, flows out from the upper end opening of the inner tube 204 to the cylindrical space 250, flows down in the cylindrical space 250, and then is discharged from the exhaust pipe 231. In this process, the F-containing gas is supplied to the surface of the member in the processing container (F-containing gas supply). At that time, the valves 261*c*, 262*c*, 261*d*, and 262*d* may be opened to supply the inert gas into the processing chamber 201 via the nozzles 230*a* and 230*b*.

Processing conditions at this step are exemplified as follows:

processing temperature: 300 to 500° C., preferably 350 to 450° C., processing pressure: 1 to 60000 Pa, preferably 5000 to 20000 Pa, F-containing gas supply flow rate: 1 to 20 slm, preferably 1 to 10 sim, inert gas supply flow rate (for each gas supply tube): 0 to 5 slm, and each gas supply time: 1 to 600 minutes, preferably 1 to 80 minutes.

By using a gas to be described later as the F-containing gas and supplying the F-containing gas under the above-described processing conditions, the deposit including the film adhered in the processing container can be removed by a thermochemical reaction (etching reaction) with the F-containing gas.

As the F-containing gas, for example, a fluorine (F)-containing gas such as a fluorinated ($F_2$) gas, a chlorine trifluoride ($ClF_3$) gas, a chlorine monofluoride (ClF) gas, a nitrogen trifluoride ($NF_3$) gas, a hydrogen fluoride (HF) gas, a nitrosyl fluoride (FNO) gas, $F_2$ gas+nitrogen oxide (NO) gas, $ClF_3$ gas+NO gas, ClF gas+NO gas, and $NF_3$ gas+NO gas can be used. One or more of them can be used as the F-containing gas. In this specification, the description of two gases such as "$NF_3$ gas+NO gas" means a mixed gas of $NF_3$ gas and NO gas. In a case of supplying the mixed gas, the two gases may be mixed (premixed) in the supply tube and then supplied into the processing chamber 201, or the two gases may be separately supplied into the processing chamber 201 from different supply tubes and mixed (post-mixed) in the processing chamber 201.

(After-Purge)

After the removal of the deposit including the film adhered in the processing container is finished, the valves 261*e*, 262*e*, 261*f*, and 262*f* are closed, and the supply of the F-containing gas into the processing chamber 201 is stopped. Then, the inert gas is supplied from each of the nozzles 230*a* and 230*b* into the processing chamber 201 and then are discharged from the exhaust pipe 231. As a result, the inside of the processing chamber 201 is purged, and a gas, a by-product and the like remaining in the processing chamber 201 are removed from the inside of the processing chamber 201 (after-purge).

(4) Precoat Process

As described above, in the cleaning process, after the removal of the deposit including the film adhered to the inside of the processing container is finished, after-purge, which is a process of removing the F-containing gas and the like from the inside of the processing container, is performed. However, even if the after-purge is performed, F might remain at a predetermined concentration in the processing container at a timing immediately after the cleaning process. F remaining in the processing container (hereinafter, a residual F component) might consume the film-forming gas in the next film forming process and reduce the amount of the film-forming gas supplied to the wafer 200. That is, the residual F component in the processing container might increase the amount of the film-forming gas consumed without contributing to the formation of the film and lower a film-forming rate. That is, the residual F component in the processing container might cause a phenomenon of reducing the thickness of the film formed on the wafer 200, that is, a film thickness drop, in the next film forming process.

Therefore, in this aspect, after the cleaning process is executed, a process of supplying the precoat gas into the processing container in which the wafer 200 is not accommodated and from which the deposit is removed and forming a precoat film in the processing container is performed. By performing this precoat process, the residual F component in the processing container is reacted with the precoat gas, the residual F component is removed from the processing container, and the concentration of F remaining in the processing container (hereinafter, the residual F concentration) can be reduced. As a result, it becomes possible to suppress occurrence of the film thickness drop in the next film forming process.

However, the discloser of the present application and the like have found that, even if the above-described precoat process is performed, the film thickness drop might locally occur in a partial region in the processing container in the next film forming process depending on the processing conditions and the like. According to intensive studies by the discloser of the present application and the like, it has been found that this phenomenon is caused by the fact that the residual F concentration in the processing container is not uniform (non-uniform) over the entire processing container at the timing immediately after the cleaning process. That is, at the timing immediately after the cleaning process, a first portion 211 having the highest residual F concentration and a second portion 222 having a lower residual F concentration than that of the first portion 211 are present in the processing container. In a case where the precoat process is performed in an entire region in the processing container under uniform processing conditions (uniform temperature distribution and the like), for example, in a situation in which the first portion 211 and the second portion 222 are present in the processing container in this manner, even if the residual F component can be sufficiently reduced in the second portion 222 having a relatively low residual F concentration, there might be a case where the residual F component cannot be sufficiently reduced in the first portion 211 having a relatively high residual F concentration. When the next film forming process is performed in this state, even if the occurrence of the film thickness drop can be prevented in the second portion 222 in which the residual F component can be sufficiently reduced, the film thickness drop locally occurs in the first portion 211 in which the residual F component cannot be sufficiently reduced, and as a result, there is a case where the film thickness uniformity of the film formed on the wafer 200, especially inter-wafer film thickness uniformity is reduced.

For such a problem, for example, a method of sufficiently reducing the residual F component not only in the second portion 222 but also in the first portion 211 by securing a long time for the precoat process and forming a thick precoat film over the entire region in the processing container is also conceivable. However, in this method, a downtime of the substrate processing apparatus becomes long, and productivity of the semiconductor device might be lowered. The precoat film is formed to be excessively thick over the entire region in the processing container, which might lead to an increase in frequency of performing the cleaning process and an increase in manufacturing cost of the semiconductor device.

Therefore, in the precoat process in this aspect, a film thickness distribution of the precoat film is adjusted in accordance with a distribution of the residual F concentration in the processing container. In the precoat process, the precoat film formed in the first portion 211 having the highest residual F concentration in the processing container is preferably made thicker than the precoat film formed in the second portion 222 having a lower residual F concentration than that in the first portion 211 in the processing container. Hereinafter, a sequence example of forming the precoat film in the processing container, that is, a precoat sequence example will be described mainly with reference to FIG. 4. In the following description, an operation of each unit forming the substrate processing apparatus is controlled by the controller 121.

In the precoat sequence in this aspect, the precoat gas is supplied into the processing container in which the wafer 200 is not accommodated and from which the deposit is removed, and the precoat film is formed in the processing container.

Hereinafter, an example of forming a nitride film as the precoat film will be described. As described above, the nitride film includes the nitride film containing C, O, B and the like in addition to the SiN film. That is, the nitride film includes the SiN film, SiCN film, SiON film, SiOCN film, SiBCN film, SiBN film, SiBOCN film, SiBON film and the like. Hereinafter, an example of forming the SiN film as the nitride film will be described.

An example is hereinafter described in which a cycle including a step of supplying the source gas as the precoat gas into the processing container and a step of supplying the reactant gas as the precoat gas into the processing container is performed a predetermined number of times (n times, n is an integer of 1 or larger) in the precoat process. The step of supplying the source gas and the step of supplying the reactant gas can be performed alternately, that is, non-simultaneously, or these steps can be performed simultaneously as in the processing sequence hereinafter described. Hereinafter, in this aspect, an example in which these steps are simultaneously performed, that is, the latter processing sequence example will be described as an example.

$$(\text{Source gas} \rightarrow \text{reactant gas}) \times n$$

$$(\text{Source gas} + \text{reactant gas}) \times n$$

An example of the aspect of the first portion 211 and the second portion 222 will be hereinafter described with reference to FIG. 3. Note that, it should be noted that the aspect hereinafter described is merely an example, and regions that might be the first portion 211 and the second portion 222 in the processing container are determined by various elements such as a structure of the processing container, the processing procedure and the processing conditions of the cleaning process, and might not match the aspect illustrated in FIG. 3.

In a case where the region in which the heat insulating plate 216 is arranged is provided in the processing container as in this aspect, there is a case where the first portion 211 includes the region in which the heat insulating plate 216 is arranged in the processing container, and the second portion 222 includes the region in which the heat insulating plate 216 is not arranged in the processing container. In a case where the region in which the wafer 200 is arranged and the region in which the heat insulating plate 216 is arranged are provided in the processing container as in this aspect, there is a case where the first portion 211 includes the region in which the heat insulating plate 216 is arranged in the processing container, and the second portion 222 includes the region in which the wafer 200 is arranged in the processing container. In FIG. 3, the heat insulating plate 216 is indicated by solid line, and the wafer 200 is indicated by dotted line. The region in which the wafer 200 is arranged means the region in which the wafer 200 is arranged in the processing container at the time of film forming process.

In a case where the region in which a plurality of heat insulating plates 216 is arranged is provided in the processing container as in this aspect, there is a case where the first portion 211 includes the region in which a plurality of heat insulating plates 216 is arranged in the processing container, and the second portion 222 includes the region in which a plurality of heat insulating plates 216 is not arranged in the processing container. In a case where the region in which a plurality of wafers 200 is arranged and the region in which a plurality of heat insulating plates 216 is arranged are provided in the processing container as in this aspect, there is a case where the first portion 211 includes the region in which a plurality of heat insulating plates 216 is arranged in the processing container, and the second portion 222 includes the region in which a plurality of wafers 200 is arranged in the processing container. The region in which a plurality of wafers 200 is arranged means a region in which a plurality of wafers 200 is arranged in the processing container at the time of film forming process.

In a case where the lower region, the center region, and the upper region are provided in the processing container as in this aspect, there is a case where the first portion 211 is the lower region in the processing container, and the second portion 222 is at least any one of the upper region and the center region in the processing container. In a case where the lower region and the region other than the lower region are provided in the processing container as in this aspect, there is a case where the first portion 211 is the lower region in the processing container, and the second portion 222 is the region other than the lower region in the processing container.

In a case where the region on the upstream side, the region on the midstream side, and the region on the downstream side of the gas flow are provided in the processing container as in this aspect, there is a case where the first portion 211 is the region on the upstream side of the gas flow in the processing container, and the second portion 222 is the region at least any one of the downstream side or the midstream side of the gas flow in the processing container. In a case where the region on the upstream side, the region other than the upstream side of the gas flow are provided in the processing container as in this aspect, there is a case where the first portion 211 is the region on the upstream side of the gas flow in the processing container, and the second portion 222 is the region other than the region on the upstream side of the gas flow in the processing container. In this aspect, since the gas flows in the processing container from the lower region side toward the upper region side described above, the region on the upstream side, the region on the midstream side, and the region on the downstream side of the gas flow correspond to the lower region, the center region, and the upper region described above, respectively.

In a case where the processing container includes the substrate transfer port 209*a* for transferring the wafer 200 into the processing container as in this aspect, there is a case where the first portion 211 is a region on the substrate transfer port 209*a* side in the processing container, and the second portion 222 is a region on the side opposite to the substrate transfer port 209*a* side in the processing container. There is a case where the first portion 211 is the region on the substrate transfer port 209*a* side in the processing container, and the second portion 222 is a region other than the region on the substrate transfer port 209*a* side in the processing container.

One reason why the first portion 211 and the second portion 222 include the above-described respective regions is a difference in conductance, that is, flow resistance of the gas in the processing container. As described above, the cleaning process is performed in a state in which the empty boat 217, for example, the boat 217 holding only the heat insulating plate 216 is accommodated in the processing container. Therefore, while the cleaning process is executed, in the region in which the heat insulating plate 216 is arranged in the processing container, the flow of the F-containing gas is hindered by the heat insulating plate 216, and the F-containing gas easily stays and remains in this region.

In contrast, while the cleaning process is executed, in the region in which the wafer 200 is arranged at the time of the film forming process in the processing container, since the wafer 200 is not present, the flow of the F-containing gas is less likely to be hindered, and the F-containing gas is less likely to stay or remain. As a result, at the timing immediately after the cleaning process, the first portion 211 includes the region in which the heat insulating plate 216 is arranged in the processing container, and the second portion 222 includes the region in which the heat insulating plate 216 is not arranged in the processing container (the region in which the wafer 200 is arranged at the time of the film forming process in the processing container).

Furthermore, one reason why the first portion 211 and the second portion 222 include the above-described respective regions is a difference in surface area of a member to which the F-containing gas may adsorb in the processing container. As described above, the cleaning process is performed in a state in which the empty boat 217, for example, the boat 217 holding only the heat insulating plate 216 is accommodated in the processing container. Therefore, while the cleaning process is executed, in the region in which the heat insulating plate 216 is arranged in the processing container, the surface area of the member to which the F-containing gas may adsorb becomes relatively large, and an adsorbing amount of the F-containing gas becomes large. In contrast, while the cleaning process is executed, in the region in which the wafer 200 is arranged at the time of the film forming process in the processing container, since the wafer 200 is not present, the surface area of the member to which the F-containing gas may adsorb becomes relatively small, and the adsorbing amount of the F-containing gas becomes small. As a result, the first portion 211 includes the region in which the heat insulating plate 216 is arranged in the processing container, and the second portion 222 includes the region in which the heat insulating plate 216 is not arranged in the processing container (the region in which the wafer 200 is arranged at the time of the film forming process in the processing container).

One reason why the first portion 211 and the second portion 222 include the above-described respective regions is the temperature distribution in the processing container. While the cleaning process is executed, in the region on the upstream side of the gas flow in the processing container (the region on the substrate transfer port 209*a* side), the temperature becomes lower than that in at least any one of the region on the downstream side and the region on the midstream side of the gas flow in the processing container (the region other than region on the upstream side of the gas flow, the region on the side opposite to the region on the substrate transfer port 209*a* side), and the F-containing gas adsorbed to the surface of the member tends to be hardly desorbed from the surface of the member. In contrast, while the cleaning process is executed, in at least any one of the regions on the downstream side and the midstream side of the gas flow in the processing container (the region other than the region on the upstream side of the gas flow, the region on the side opposite to the region on the substrate transfer port 209*a* side), the temperature becomes higher than that in the region on the upstream side of the gas flow in the processing container (the region on the substrate transfer port 209*a* side), and the F-containing gas adsorbed to the surface of the member tends to be easily desorbed from the surface of the member. As a result, the first portion 211 includes the region on the upstream side of the gas flow in the processing container (the region on the substrate transfer port 209*a* side), and the second portion 222 includes at least any one of the regions on the downstream side and the midstream side of the gas flow in the processing container (the region other than the region on the upstream side of the gas flow, the region on the side opposite to the region on the substrate transfer port 209*a* side).

(Pressure Regulation and Temperature Regulation)

After the cleaning process is finished, the inside of the processing chamber 201 is vacuum-exhausted (decompression-exhausted) by the vacuum pump 246 so as to achieve a desired pressure (vacuum degree). At that time, the pressure in the processing chamber 201 is measured by the pressure sensor 245, and the APC valve 242 is feedback-controlled based on the measured pressure information (pressure regulation). The inside of the processing chamber 201 is heated by the heater 206 so as to reach desired processing temperature. At that time, the degree of energization to the heater 206, that is the degree of energization to each of the five zones (L, CL, C, CU, and U) included in the heater 206 is independently feedback-controlled based on temperature information detected by the temperature sensor 263, so that the temperature in the processing chamber 201 has a desired temperature distribution (temperature regulation). Rotation of the empty boat 217 by the rotation mechanism 254 is started. The operation of the vacuum pump 246, the heating of the inside of the processing chamber 201, and the rotation of the boat 217 are all continuously performed at least until the cleaning process is finished. However, the boat 217 does not have to be rotated.

(Precoat Process)

Thereafter, following steps 3 and 4 are sequentially executed.

[Step 3]

At step 3, the source gas and the reactant gas are simultaneously supplied as the precoat gas into the processing chamber 201 in which the wafer 200 is not accommodated.

A specific processing procedure can be similar to the processing procedure at step 1 in the film forming process described above. As the source gas, one or more of the source gases exemplified in the film forming process described above can be used. As the reactant gas, one or more of the reactant gases exemplified in the film forming process described above can be used. The source gas and the reactant gas supplied into the processing chamber 201 rise in the processing chamber 201, flow out from the upper end opening of the inner tube 204 to the cylindrical space 250, flow down in the cylindrical space 250, and then are discharged from the exhaust pipe 231. In this process, the source gas and the reactant gas are mixed, and the mixed source gas and reactant gas are supplied to the surface of the member in the processing container (precoat gas supply). At that time, the valves 261*c*, 262*c*, 261*d*, and 262*d* may be opened to supply the inert gas into the processing chamber 201 via the nozzles 230*a* and 230*b*.

Processing conditions at this step are exemplified as follows:

- processing temperature: 600 to 850° C., preferably 700 to 800° C.,
- processing pressure: 1 to 2666 Pa, preferably 13 to 1333 Pa, source gas supply flow rate: 0.01 to 2 slm, preferably 0.05 to 0.5 slm,
- reactant gas supply flow rate: 0.1 to 10 slm, preferably 0.5 to 5 slm,
- inert gas supply flow rate (for each gas supply tube): 0 to 5 slm, and
- each gas supply time: 1 to 120 minutes, preferably 1 to 60 minutes.

By performing step 3 under the above-described processing condition using, for example, the chlorosilane-based gas described above as the source gas and using, for example, the nitriding gas described above as the reactant gas, a layer containing Si and N, that is, a silicon nitride layer (SiN layer) is formed on the outermost surface of the member in the processing container by a thermal CVD reaction. In this process, the residual F component in the processing container is removed by reaction with the precoat gas and discharged from the processing container. The member in the processing container includes, for example, at least any one of the process tube 203, the boat 217, the heat insulating plate 216, the manifold 209, the rotary shaft 255, the seal cap 219 and the like.

[Step 4]

After step 3 is finished, the inside of the processing chamber 201 is vacuum-exhausted according to the similar processing procedure and processing conditions to those at step 2 in the film forming process, and the gas and the like remaining in the processing chamber 201 are removed from the inside of the processing chamber 201 and the inside of the processing chamber 201 is purged. At that time, as at step 2, the purge gas may be supplied into the processing chamber 201. As the purge gas, the reactant gas and inert gas described above can be used as at step 2.

[Predetermined Number of Times of Performance]

A cycle in which steps 3 and 4 described above are performed not simultaneously, that is, asynchronously, may be performed a predetermined number of times (n times: n is an integer of 1 or larger) to form a silicon nitride film (SiN film) having a desired thickness, for example, as the precoat film on the surface of the member in the processing container. As in the above-described film forming process, the above-described cycle is preferably repeated a plurality of times, and a SiCN film can be formed as the precoat film on the surface of the member in the processing container in a case where the N, C, and H-containing gas is used as the reactant gas.

As described above, in the precoat process in this aspect, the film thickness distribution of the precoat film is adjusted in accordance with the distribution of the residual F concentration in the processing container after the cleaning process is executed. In the precoat process in this aspect, the precoat film formed in the first portion 211 having the highest residual F concentration in the processing container is preferably made thicker than the precoat film formed in the second portion 222 having a lower residual F concentration than that in the first portion 211 in the processing container.

In this aspect, in order to achieve the above-described film thickness distribution in the precoat film, preferably, the degree of energization to each of the five zones (L, CL, C, CU, and U) included in the heater 206 is independently adjusted, and the ratio of the temperature of the first portion 211 to the temperature of the second portion 222 in the precoat process is made larger than the ratio of the temperature of the first portion 211 to the temperature of the second portion 222 in at least any one of the film forming process described above (before cleaning) and the film forming process to be described later (after precoating).

In this aspect, in order to achieve the above-described film thickness distribution in the precoat film, preferably, in the precoat process, the degree of energization to each of the five zones (L, CL, C, CU, and U) included in the heater 206 is independently adjusted, and the temperature of the first portion 211 is made higher than the temperature of the second portion 222.

In this aspect, in order to achieve the above-described film thickness distribution in the precoat film, preferably, the degree of energization to each of the five zones (L, CL, C, CU, and U) included in the heater 206 is independently adjusted, and the temperature of the first portion 211 in the precoat process is made higher than the temperature of the first portion 211 in at least any one of the above-described film forming process (before cleaning) and the film forming process described later (after precoating).

(After-Purge and Atmospheric Pressure Restoration)

After the formation of the precoat film in the processing container is finished, the inert gas is supplied from each of the nozzles 230*a* and 230*b* into the processing chamber 201 and is discharged from the exhaust pipe 231. As a result, the inside of the processing chamber 201 is purged, and a gas, a by-product and the like remaining in the processing chamber 201 are removed from the inside of the processing chamber 201 (after-purge). Thereafter, the atmosphere in the processing chamber 201 is replaced with the inert gases (inert gas replacement), so that the pressure in the processing chamber 201 is restored to a normal pressure (atmospheric pressure restoration).

(Empty Boat Unload)

Thereafter, the boat elevator 115 lowers the seal cap 219, so that the lower end of the manifold 209 is opened. Then, the empty boat 217 is carried out of the process tube 203 from the lower end opening of the manifold 209 (substrate transfer port 209*a*) (boat unloading). After the boat unloading, the shutter 219*a* is moved, so that the lower end opening of the manifold 209 is sealed with the shutter 219*a* via the O-ring 220*c* (shutter close).

(5) Film Forming Process (after Precoating)

After the precoat process is executed, the film forming process similar to the above-described film forming process (before cleaning) is performed again on a new wafer 200. That is, a process of supplying the film-forming gas into the processing container after the precoat film is formed in which the new wafer 200 is accommodated to form a film on the new wafer 200 is performed again. Processing procedures and processing conditions at that time can be similar to the processing procedures and the processing conditions in the above-described film forming process (before cleaning). As the source gas, one or more of the source gases exemplified in the film forming process (before cleaning) can be used. As the reactant gas, one or a plurality of the reactant gases exemplified in the film forming process (before cleaning) can be used.

(6) Effects by Present Aspect

According to the present aspect, one or a plurality of the following effects can be obtained.

(a) In the precoat process, by adjusting the film thickness distribution of the precoat film in accordance with the distribution of the residual F concentration in the processing container, it is possible to suppress local occurrence of the reaction between the residual F component and the film-forming gas in the processing container in the film forming process (after precoating). As a result, in the film forming process (after precoating), it is possible to suppress a local increase in amount of the film-forming gas consumed without contributing to the formation of the film on the wafer 200, and it becomes possible to suppress local occurrence of the film thickness drop.

(b) In the precoat process, by making the precoat film formed in the first portion 211 thicker than the precoat film formed in the second portion 222, it becomes possible to suppress the reaction between the residual F component and the film-forming gas from locally excessively occurring in a portion having the highest residual F concentration in the processing container in the film forming process (after precoating). As a result, in the film forming process (after precoating), it is possible to suppress the amount of the film-forming gas consumed without contributing to the formation of the film on the wafer 200 from locally increasing in the portion, and it is possible to suppress the film thickness drop from locally excessively occurring in the portion.

(c) By making the ratio of the temperature of the first portion 211 to the temperature of the second portion 222 in the precoat process larger than the ratio of the temperature of the first portion 211 to the temperature of the second portion 222 in at least any one of the film forming process (before cleaning) and the film forming process (after precoating), it becomes easy to make the precoat film formed in the first portion 211 thicker than the precoat film formed in the second portion 222 in the precoat process.

(d) In the precoat process, by setting the temperature of the first portion 211 higher than the temperature of the second portion 222, the precoat film formed in the first portion 211 can be made thicker than the precoat film formed in the second portion 222 in the precoat process.

(e) By setting the temperature of the first portion 211 in the precoat process higher than the temperature of the first portion 211 in the film forming process (before cleaning), the precoat film formed in the first portion 211 can be made thicker than the precoat film formed in the second portion 222 in the precoat process.

Figure 3:
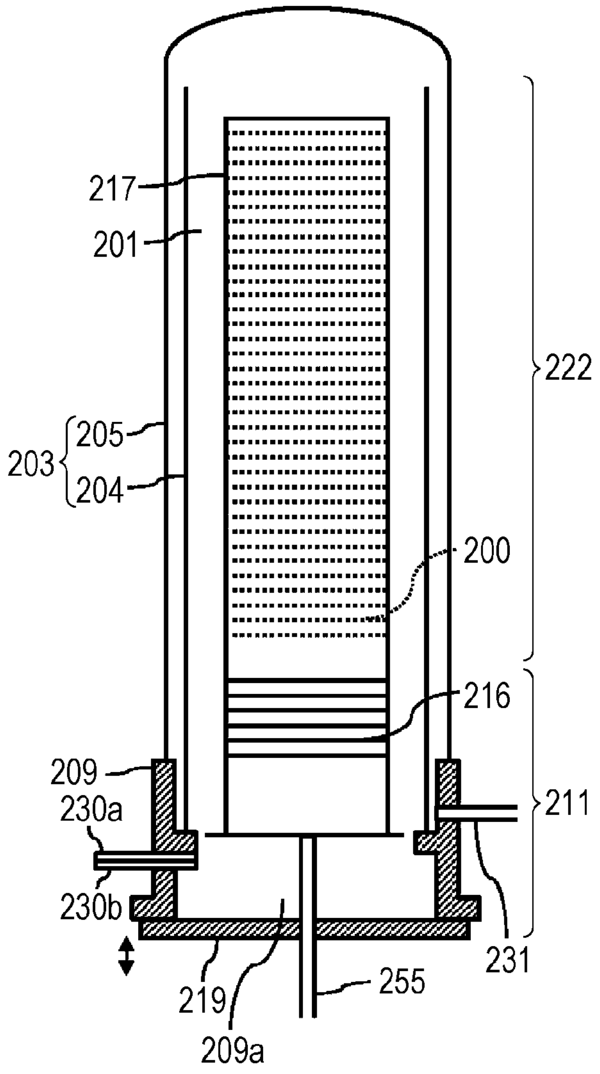
FIG. 3 is a schematic configuration diagram of a vertical processing furnace of a substrate processing apparatus preferably used in an aspect of the present disclosure, and is a longitudinal cross-sectional view of a processing container.

(f) Even in a case where the first portion 211 and the second portion 222 have the above-described aspects exemplified with reference to FIG. 3, one or a plurality of the above-described various effects can be obtained.

(g) The above-described effect can be similarly obtained also in a case where the above-described source gas and reactant gas are used in the film forming process (before cleaning, after precoating), in a case where the above-described source gas and reactant gas are used in the precoat process, in a case where the above-described F-containing gas is used in the cleaning process, and in a case where the above-described various inert gases are used in each of the processes.

(7) Variations

Various types of processes in this aspect can be changed as in the following variation. Also in these variations, the effect similar to that in the above-described aspect can be obtained. Furthermore, these variations can be combined optionally. Unless otherwise described, the processing procedure and the processing condition at each step of each variation can be similar to the processing procedure and the processing condition at each step of each process described above.

Variation 1

In the film forming process (before cleaning), the temperature of the first portion 211 may be made equal to or lower than the temperature of the second portion 222. According to the present variation, it is possible to improve film thickness uniformity of the film formed on the wafer 200, especially inter-wafer film thickness uniformity, in the film forming process (before cleaning). Furthermore, in the film forming process (before cleaning), the temperature of the first portion 211 is made lower than the temperature of the second portion 222, so that the effect herein described can be further enhanced.

Variation 2

In the cleaning process, the temperature of the first portion 211 may be made equal to or lower than the temperature of the second portion 222. According to the present variation, in the cleaning process, it is possible to uniformly remove the deposit including the film adhered in the processing container. Furthermore, in the cleaning process, the temperature of the first portion 211 is made lower than the temperature of the second portion 222, so that the effect herein described can be further enhanced.

Variation 3

In the film forming process (before precoating), the temperature of the first portion 211 may be made equal to or lower than the temperature of the second portion 222. According to the present variation, it becomes possible to improve film thickness uniformity of the film formed on the wafer 200, especially inter-wafer film thickness uniformity, in the film forming process (before precoating). Furthermore, in the film forming process (after precoating), the temperature of the first portion 211 is made lower than the temperature of the second portion 222, so that the effect herein described can be further enhanced.

Other Aspects of Present Disclosure

The aspect of the present disclosure has been specifically described above. However, the present disclosure is not limited to the aspect described above, and various changes can be made without departing from the gist thereof.

For example, as the reactant gas, in addition to the above-described N and H-containing gas and the N, C, and H-containing gas, for example, a carbon (C)-containing gas such as an ethylene ($C_2H_4$) gas, an acetylene ($C_2H_2$) gas, and a propylene ($C_3H_6$) gas, a boron (B)-containing gas such as a diborane ($B_2H_6$) gas and a trichloroborane ($BCl_3$) gas, and an oxygen (O)-containing gas such as an oxygen ($O_2$) gas, an ozone ($O_3$) gas, a plasma-excited $O_2$ gas ($O_2$*), $O_2$ gas+hydrogen ($H_2$) gas, a water vapor ($H_2O$) gas, a hydrogen peroxide ($H_2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas can be used.

Then, by the film-forming sequence hereinafter described, also in a case where a film containing Si such as a silicon oxynitride film (SiON film), a silicon oxycarbide film (SiOC film), a silicon oxycarbonitride film (SiOCN film), a silicon borocarbonitride film (SiBCN film), a silicon boronitride film (SiBN film), and a silicon oxide film (SiO film) is formed on the substrate in addition to the SiN film and SiCN film, the above-described cleaning process and precoat process may be preferably applied. Also in these cases, at least a part of the effects described in the above-described aspect can be obtained. The processing procedure and the processing condition when supplying the source gas and the reactant gas can be similar to those at respective steps of the above-described aspect, for example. Also in these cases, the effect similar to that in the aspect described above can be obtained.

For example, also in a case of forming a film containing a metal element such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN), a tungsten nitride film (WN), an aluminum oxide film (AlO film), a titanium oxide film (TiO film), a hafnium oxide film (HfO film), a zirconium oxide film (ZrO film), a tantalum oxide film (TaO film), a molybdenum oxide film (MoO), a tungsten oxide film (WO), a titanium oxynitride film (TiON film), a titanium aluminum carbonitride film (TiAlCN film), a titanium aluminum carbide film (TiAlC film), or a titanium carbonitride film (TiCN film) by the above-described film-forming sequence by using the source gas containing a metal element such as aluminum (Al), titanium (Ti), hafnium (Hf), zirconium (Zr), tantalum (Ta), molybdenum (Mo), or tungsten (W) as the source gas, the cleaning process and the precoat process described above can also be suitably applied. Also in these cases, at least a part of the effects described in the above-described aspect can be obtained. The processing procedure and the processing condition when supplying the source gas and the reactant gas can be similar to those at respective steps of the above-described aspect, for example. Also in these cases, the effect similar to that in the aspect described above can be obtained.

Preferably, the recipe used in each process is individually prepared according to processing contents and stored in the memory 121*c* via an electric communication line or the external memory 123. Then, when each process is started, the CPU 121*a* preferably appropriately selects an appropriate recipe from among the plurality of recipes stored in the memory 121*c* according to processing contents. As a result, film forming processes of various film types, composition ratios, film qualities, and film thicknesses, the cleaning process corresponding to various films, and the precoat process can be performed with high reproducibility by one substrate processing apparatus. It is possible to reduce a burden on an operator, and it is possible to quickly start each process while avoiding an operation error.

The above-described recipe is not limited to a newly created one, and may be prepared by changing the existing recipe already installed in the substrate processing apparatus, for example. In a case of changing the recipe, the changed recipe may be installed in the substrate processing apparatus via an electric communication line or a recording medium in which the recipe is recorded. In addition, the input/output device 122 of the existing substrate processing apparatus may be operated, and the existing recipe already installed in the substrate processing apparatus may be directly changed.

In the above-described aspect, an example has been described in which the film forming process, cleaning process, and precoat process are performed using a batch type substrate processing apparatus that processes a plurality of substrates at one time. The present disclosure is not limited to the above-described aspect, and can be suitably applied to a case where the film forming process, the cleaning process, and the precoat process is performed using a single wafer type substrate processing apparatus that processes one or a plurality of substrates at one time, for example. In the above-described aspect, an example has been described in which the film forming process, cleaning process, and precoat process are performed using the substrate processing apparatus including a hot wall-type processing furnace. The present disclosure is not limited to the above-described aspect, and can be suitably applied to a case of performing the film forming process, cleaning process, and precoat process using the substrate processing apparatus including a cold wall-type processing furnace.

Even in a case where these substrate processing apparatuses are used, each process can be performed with the similar processing procedure and processing conditions as those in the aspect and variation described above, and the effect similar to that in the aspect and variation described above can be obtained.

The above-described aspects and variations can be used in combination as appropriate. Processing procedures and processing conditions at that time can be similar to the processing procedures and the processing conditions in the above-described aspects and variations, for example.

EXAMPLES

Example 1

The film forming process, cleaning process, and precoat process in the above-described aspects were performed using the substrate processing apparatus illustrated in FIG. 1. In the precoat process, temperature of a lower region in a processing container was made higher than temperature of an upper region and a center region in the processing container. When a film thickness of a precoat film was measured, it was confirmed that a film thickness $T_1$ of the precoat film formed in the lower region in the processing container was larger than a film thickness $T_2$ of the precoat film formed in the upper region and the center region in the processing container. $T_1$ was 1.2 to 1.4 times $T_2$. After the precoat process, the film forming process was performed again in the processing container in which the precoat film was formed, and the film thickness of the film formed on the wafer was measured. In the film forming process, a SiN film was formed on a wafer, and in the precoat process, a SiN film was formed as the precoat film in the processing container.

Comparative Example 1

The film forming process and cleaning process in the above-described aspects were performed using the substrate processing apparatus illustrated in FIG. 1, and the precoat process was performed under processing conditions different from those in Example 1. In the precoat process, temperature of a lower region in a processing container was made lower than temperature of an upper region and a center region in the processing container. When a film thickness of a precoat film was measured, it was confirmed that a film thickness $T_3$ of the precoat film formed in the lower region in the processing container was smaller than a film thickness $T_4$ of the precoat film formed in the upper region and the center region in the processing container. $T_3$ was 0.7 to 0.9 times $T_4$. After the precoat process, the film forming process was performed again in the processing container in which the precoat film was formed, and the film thickness of the film formed on the wafer was measured. In the film forming process, a SiN film was formed on a wafer, and in the precoat process, a SiN film was formed as the precoat film in the processing container.

Note that, it was confirmed that the film thickness $T_1$ of the precoat film formed in the lower region in the processing container in Example 1 was larger than the film thickness $T_3$ of the precoat film formed in the lower region in the processing container in Comparative Example 1. $T_1$ was 1.4 to 1.6 times $T_3$. It was confirmed that the film thickness of the precoat film formed in the upper region and the center region in the processing container in Example 1 was equivalent to the film thickness of the precoat film formed in the upper region and the center region in the processing container in Comparative Example 1.

As a result, in comparative example 1, it was confirmed that the film thickness of the film formed on the wafer arranged in the lower region was thinner than the film thickness of the film formed on the wafer arranged in each of the upper region and the center region in the film forming process after the precoat process. That is, in comparative example 1, it was confirmed that the film thickness drop occurred in the lower region.

In contrast, in Example 1, it was confirmed that the film thicknesses of the films formed on the wafers arranged in each of the upper region, the center region, and the lower region were the same in the film forming process after the precoat process. That is, in Example 1, it was confirmed that the film thickness drop did not occur in any of the upper region, the center region, and the lower region.

According to the present disclosure, occurrence of film thickness drop in a processing container after cleaning can be suppressed.

What is claimed is:

1. A processing method comprising:

(a) supplying a film-forming gas into a processing container in which a substrate is accommodated to form a film on the substrate;

(b) supplying a fluorine-containing gas into the processing container in which the substrate is not accommodated to remove a deposit including the film adhered to the inside of the processing container;

(c) supplying a precoat gas into the processing container in which the substrate is not accommodated and from which the deposit is removed to form a precoat film in the processing container; and (d) supplying a film-forming gas into the processing container in which a substrate is accommodated and in which the precoat film is formed to form a film on the substrate, wherein in (c), a film thickness distribution of the precoat film is adjusted in accordance with a distribution of a residual fluorine concentration in the processing container.

2. The processing method according to claim 1, wherein in (c), the precoat film formed in a first portion having a highest residual fluorine concentration in the processing container is made thicker than the precoat film formed in a second portion having a lower residual fluorine concentration than the residual fluorine concentration in the first portion in the processing container.

3. The processing method according to claim 2, wherein a ratio of temperature of the first portion to temperature of the second portion in (c) is made larger than a ratio of temperature of the first portion to temperature of the second portion in at least one selected from the group of (a) and (d).

4. The processing method according to claim 2, wherein in (c), temperature of the first portion is made higher than temperature of the second portion.

5. The processing method according to claim 4, wherein in (a), temperature of the first portion is made equal to or lower than temperature of the second portion.

6. The processing method according to claim 4, wherein in (b), temperature of the first portion is made equal to or lower than temperature of the second portion.

7. The processing method according to claim 4, wherein in (d), temperature of the first portion is made equal to or lower than temperature of the second portion.

8. The processing method according to claim 2, wherein temperature of the first portion in (c) is made higher than temperature of the first portion in at least one selected from the group of (a) and (d).

9. The processing method according to claim 2, wherein a region in which a heat insulating plate is arranged is provided in the processing container, the first portion includes the region in which the heat insulating plate is arranged in the processing container, and the second portion includes a region in which the heat insulating plate is not arranged in the processing container.

10. The processing method according to claim 2, wherein a region in which a substrate is arranged and a region in which a heat insulating plate is arranged are provided in the processing container, the first portion includes the region in which the heat insulating plate is arranged in the processing container, and the second portion includes the region in which the substrate is arranged in the processing container.

11. The processing method according to claim 2, wherein a region in which a plurality of heat insulating plates is arranged is provided in the processing container, the first portion includes the region in which the plurality of heat insulating plates is arranged in the processing container, and the second portion includes a region in which the plurality of heat insulating plates is not arranged in the processing container.

12. The processing method according to claim 2, wherein a region in which a plurality of substrates is arranged and a region in which a plurality of heat insulating plates is arranged are provided in the processing container, the first portion includes the region in which the plurality of heat insulating plates is arranged in the processing container, and the second portion includes the region in which the plurality of substrates is arranged in the processing container.

13. The processing method according to claim 2, wherein the first portion is a lower region in the processing container, and the second portion is at least one selected from the group of an upper region and a center region in the processing container.

14. The processing method according to claim 2, wherein the first portion is a lower region in the processing container, and the second portion is a region other than the lower region in the processing container.

15. The processing method according to claim 2, wherein the first portion is a region on an upstream side of a gas flow in the processing container, and the second portion is a region on at least one selected from the group of a downstream side and a midstream side of the gas flow in the processing container.

16. The processing method according to claim 2, wherein the first portion is a region on an upstream side of a gas flow in the processing container, and the second portion is a region other than the region on the upstream side of the gas flow in the processing container.

17. The processing method according to claim 2, wherein the processing container includes a substrate transfer port through which a substrate is transferred into the processing container, the first portion is a region on a side of the substrate transfer port in the processing container, and the second portion is a region on a side opposite to the region on the side of the substrate transfer port in the processing container.

18. The processing method according to claim 2, wherein the processing container includes a substrate transfer port through which a substrate is transferred into the processing container, the first portion is a region on a side of the substrate transfer port in the processing container, and the second portion is a region other than the region on the side of the substrate transfer port in the processing container.

19. A method of manufacturing a semiconductor device, the method comprising:

the method according to claim 1.

20. A non-transitory computer-readable recording medium storing a program that causes, by a computer, a processing apparatus to perform a process comprising:

(a) supplying a film-forming gas into a processing container in which a substrate is accommodated to form a film on the substrate;

(b) supplying a fluorine-containing gas into the processing container in which the substrate is not accommodated to remove a deposit including the film adhered to the inside of the processing container;

(c) supplying a precoat gas into the processing container in which the substrate is not accommodated and from which the deposit is removed to form a precoat film in the processing container;

(d) supplying a film-forming gas into the processing container in which a substrate is accommodated and in which the precoat film is formed to form a film on the substrate; and adjusting a film thickness distribution of the precoat film in accordance with a distribution of a residual fluorine concentration in the processing container in (c).

* * * * *